United States Patent [19]

Shafie

[11] Patent Number: 5,767,667
[45] Date of Patent: Jun. 16, 1998

[54] MAGNETIC CORE NON-CONTACT CLAMP-ON CURRENT SENSOR

[75] Inventor: Matt H. Shafie, Casselberry, Fla.

[73] Assignee: Bell Technologies, Inc., Orlando, Fla.

[21] Appl. No.: 399,710

[22] Filed: Mar. 3, 1995

[51] Int. Cl.$^6$ ................................................ G01R 1/20
[52] U.S. Cl. ........................................ 324/117 R; 324/127
[58] Field of Search ............................. 324/117 R, 127; 336/175, 212

[56] References Cited

U.S. PATENT DOCUMENTS

| | | | |
|---|---|---|---|
| 2,820,109 | 1/1958 | Dewitz | 336/212 |
| 3,007,106 | 10/1961 | Bergh | 324/117 R |
| 3,074,012 | 1/1963 | Smith-Vaniz, Jr. | 336/212 |
| 3,757,201 | 9/1973 | Cornwell | 336/212 |

*Primary Examiner*—Ernest F. Karlsen
*Attorney, Agent, or Firm*—Stein, Pendorf & Van Der Wall

[57] ABSTRACT

A magnetic core for a non-contact clamp-on current sensor having a magnetic core that is adapted for encircling a current-carrying conductor wherein the magnetic core includes a first portion having a first integral toroidal section and a first pair of opposing side walls extending therefrom, a second portion having a second integral toroidal section and a second pair of opposing side walls extending therefrom such that the first portion and second portion are coupled together at the first and second pairs of opposing side walls so to define an aperture therebetween for receiving a current carrying conductor and measuring the line current therein. The first and second integral toroidal sections of the magnetic core are designed so to be void of any discontinuities within the flow path of the magnetic flux and so to have a circular shape which promotes a more thorough flux saturation. The lack of discontinuities in, and the circular shape of, the flow path of the magnetic flux in the toroidal sections promotes a more thorough saturation of the magnetic core which results in the reduction of zero errors and the obtaining of more accurate line current measurements.

3 Claims, 7 Drawing Sheets

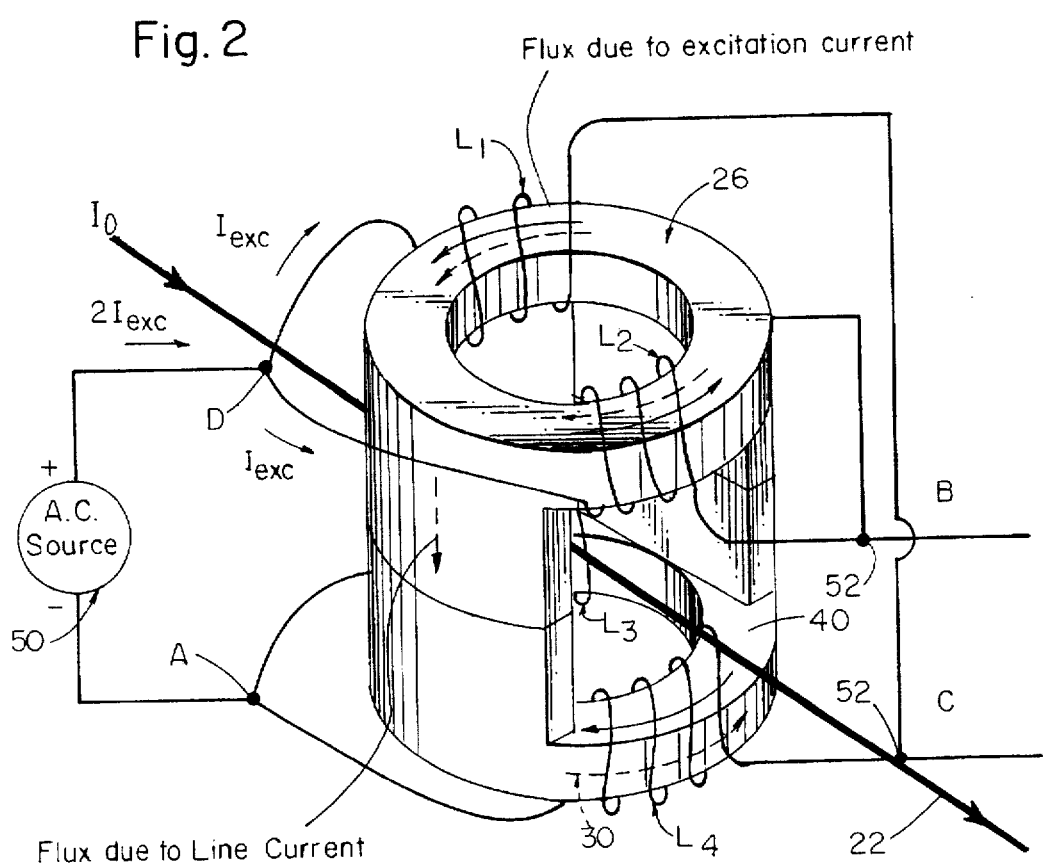

1

MAGNETIC CORE NON-CONTACT CLAMP-ON CURRENT SENSOR

BACKGROUND OF THE INVENTION

1. Field of the Invention

This invention relates to a magnetic core for use in an electrical current sensor and, more particularly, to a magnet core for a non-contact clamp-on current sensor wherein the electromagnetic measurement technique is utilized.

2. Description of the Background Art

Many types of magnetic core electric current measurement sensors utilizing the electromagnetic technique are known and are in wide use today throughout the electrical industry.

Non-contact clamp-on current sensors provide a convenient means for measuring a DC to high frequency line current in a current carrying conductor without a need to interrupt the circuit to insert the measuring device. The prior art non-contact current sensors are generally provided with a magnetic core that surrounds the conductor. The magnetic core is typically comprised of several sections that are pieced together so that the current carrying conductor can be measured. By the magnetic core encircling the current carrying conductor, a single turn winding has, in effect, been established on the magnetic core.

Generally, the non-contact current sensors utilize the hysteresis characteristic of a magnetic core to measure the line current in the current carrying conductor. In effect, the line current to be measured in the current carrying conductor acts to magnetically adjust the magnetic core by way of coupling the magnetic field generated by the line current. The magnetic core generally includes sensing windings positioned thereon of which carry an excitation current of a general fundamental frequency. The magnetic fields associated with the excitation current are coupled to the magnetic core wherein a magnetic flux is produced therein and caused to flow. The magnetic flux then induces an AC output voltage on the output terminals of which is a second order or higher even harmonic of the fundamental frequency. When no line current is flowing in the current carrying conductor the AC output voltage detected on the output terminals is zero. Upon the introduction of a line current in the current carrying conductor, the AC output voltage changes and the detected value is proportional to the amplitude and polarity of the line current being measured.

The accuracy of the line current measurements depend greatly upon the type of material used, the shape, and the particular construction of the magnetic core. The shape of the magnetic core and the continuity existing in the path of which the magnetic flux flows within the magnetic core greatly affects the efficiency of the magnetic core.

In the magnetic cores utilized in the prior art, the magnetic flux paths that exist are pieced together, having many discontinuities therein. These discontinuities in the flow path of the magnetic flux magnify the problems with zero errors in the measurements. In essence, any discontinuities in the saturating path of the magnetic core will act as a gap and, therefore, require more drive signal to achieve magnetic core saturation. Additionally, the shape of the prior art magnetic cores often served not to achieve maximum saturation. Representative current sensors are disclosed in U.S. Pat. Nos. 3,323,056, 3,490,042, 4,118,597, 4,243,931, 4,266, 190, 4,274,051, 4,274,052, 4,278,939, 4,286,211, 4,309,655, 4,362,990, 4,482,862, 4,529,931, 4,914,381, 4,914,383, 5,008,612, and 5,307,008, the disclosures of which are hereby incorporated by reference herein.

Typical examples of clamp-on type magnetic cores that have been used in the prior art are seen in Bergh, U.S. Pat. No. 3,007,106, and Harnden, U.S. Pat. No. 4,471,300. In the Bergh patent, the magnetic core is comprised of many pieced together portions that essentially introduce many discontinuities in the magnetic core as well as provide a non-ideal magnetic flux path. The magnetic core taught in the Bergh patent is of a general square shape that limits the amount of flux saturation that can be achieved.

In the Harnden patent, the magnetic core is comprised generally of a circular toroidal loop having a hinge in one section and a pin and groove type of securing means in an opposite section of the magnetic core. This particular magnetic core, as taught by Harnden, operates as a current transformer in principle. Additionally, the Harnden patent is limited in that it is incapable of measuring Direct Current.

In addition, the prior art magnetic cores, as utilized currently in the industry, are expensive to manufacture and require the assembling of various portions. Moreover, the magnetic cores currently being used in the industry for clamp-on current sensors have inherent aspects that contribute to inaccuracies in current measurements.

Therefore, it is an object of this invention to provide improvements to overcome the aforementioned inadequacies of the prior art magnetic cores and provide an improvement which is a significant contribution to the advancement of the current sensing art.

Another object of this invention is to provide a magnetic core for a non-contact clamp-on current sensor which is to be constructed from only two conventional toroidal cores.

Another object of this invention is to provide a magnetic core for a non-contact clamp-on current sensor which is comprised of two toroidal cores that are without discontinuities within the flow path of the magnetic flux so as to minimize inaccuracies in line current measurements and provide a low power requirement for operation.

Another object of this invention is to provide a magnetic core for a non-contact clamp-on current sensor of which two toroidal cores are utilized having a circular shape so that a more thorough and optimum flux saturation is achieved in the magnetic core thereby reducing the problems associated with zero errors.

Another object of this invention is to provide a magnetic core for a non-contact clamp-on current sensor whereby the magnetic core is easy and inexpensive to manufacture in that they can be cut similar to a conventional toroidal ferrite core and no piece assembly is necessary.

Another object of this invention is to provide a magnetic core for a non-contact clamp-on current sensor wherein the magnetic core comprises in combination: a first portion, the first portion including a first integral toroidal section having a first internal side, a first pair of opposing side walls extending from the first internal side, a first cut portion, and a second cut portion positioned between said first pair of opposing side walls; a second portion, the second portion including a second integral toroidal section having a second internal side, a second pair of opposing side walls extending from the second internal side, a third cut portion and a fourth cut portion positioned between the second pair of opposing side walls, the second pair of opposing side walls being in alignment with and coupled to the first pair of opposing side walls thereby forming an aperture therethrough, the aperture facilitating the placement of the conductor therethrough; a first set of windings positioned on the first integral toroidal section thereby producing magnetic flux in the first integral toroidal section due to an excitation current flowing through the first set of windings; a second set of windings positioned on the second integral toroidal section thereby producing magnetic flux in the second integral toroidal section due to the excitation current flowing through the second set of windings; and a means for connecting the first and second sets of windings to form a circuit.

The foregoing has outlined some of the pertinent objects of the invention. These objects should be construed to be merely illustrative of some of the more prominent features and applications of the intended invention. Many other beneficial results can be obtained by applying the disclosed invention in a different manner or modifying the invention within the scope of the disclosure. Accordingly, other objects and a more comprehensive understanding of the invention may be obtained by referring to the summary of the invention, and the detailed description of the preferred embodiment in addition to the scope of the invention defined by the claims taken in conjunction with the accompanying drawings.

SUMMARY OF THE INVENTION

For the purpose of summarizing this invention, this invention comprises a magnetic core for a non-contact clamp-on current sensor of which the design thereof obviates the inaccuracies and limitations associated with the prior art magnetic cores as utilized in the industry.

More particularly, the magnetic core of the invention comprises two integral toroidal sections of which are free from any discontinuities that would introduce inaccuracies in line current measurements and require higher power for operation. Due to the present invention requiring low power for operation, the magnetic core can be used in battery powered handheld current sensors. Further, the two integral toroidal sections are shaped in a circular manner so as to promote a more thorough flux saturation therein thereby reducing zero errors that are common in the prior art magnetic cores. The integral toroidal sections of the present invention are composed of a ferrite material and are cut in a similar manner as a conventional toroidal ferrite core.

The magnetic core of the invention is comprised generally of a first portion and a second portion of which are mounted together via a first pair of opposing side walls positioned on the first portion of the magnetic core and a second pair of opposing side walls positioned on the second portion of the magnetic core. The first pair of opposing side walls positioned on the first portion includes a first and second cut portion therebetween. The second pair of opposing side walls positioned on the second portion includes a third and fourth cut portion therebetween.

Upon coupling the first portion to the second portion of the magnetic core, the first and second cut portions of the first portion are placed in alignment with the third and fourth cut portions of the second portion respectively. The first, second, third and fourth cut portions, thereby forming an aperture of which the current carrying conductor is placed through when a line current measurement is desired.

A first set of windings are positioned on the first integral toroidal section of the first portion and a second set of windings are positioned on the second integral toroidal section of the second portion whereby the flow of the magnetic flux generated by the excitation current in the respective first and second integral toroidal sections are in opposite directions. The first and second sets of windings comprise the sensing windings of the magnetic core of which sense the changes in magnetic flux caused by the line current in the current carrying conductor. The sensing windings then provide an AC output voltage at output terminals that is proportional to the measured line current in the current carrying conductor.

An important feature of the present invention is that the complete magnetic core construction is comprised of only two magnetic core pieces such that the magnetic core is easy to manufacture and assemble.

Another important feature of the present invention is that the configuration of the first and second integral toroidal sections, of each respective first and second portion, functions to provide a magnetic flux path free of discontinuities of which promotes a more thorough flux saturation of the magnetic core and provides for a low power requirement for operation. Thus, the line current measurements achieved by the magnetic core of the present invention are more accurate and less susceptible to zero errors.

Another important feature of the present invention is that the magnetic core for a non-contact clamp-on current sensor has an aperture that readily receives current carrying conductors of various sizes. The aperture, being formed by the respective cut portions of the first and second portions of the magnetic core, is positioned so as to place the current carrying conductor in close proximity with the first and second integral toroidal sections thereby creating a thorough flux saturation in the magnetic core. Due to the thorough flux saturation, the non-contact clamp-on current sensor is more sensitive and, therefore, can provide more accurate and exact measurements.

The foregoing has outlined rather broadly the more pertinent and important features of the present invention. The detailed description of the present invention that follows is offered so that the present contribution to the art may be more fully appreciated. Additional features of the invention will be described hereinafter. These form the subject of the claims of the invention. It should be appreciated by those skilled in the art that the conception and the disclosed specific embodiment may be readily utilized as a basis for modifying or designing other methods and structures for carrying out the same purposes of the present invention. It should also be realized by those skilled in the art that such equivalent methods and structures do not depart from the spirit and scope of the invention as set forth in the appended claims.

BRIEF DESCRIPTION OF THE DRAWINGS

For a fuller understanding of the nature and objects of the invention, reference should be had to the following detailed description taken in connection with the accompanying drawings in which:

FIG. 2 is an isometric view of the non-contact clamp-on current sensor, utilizing the magnetic core of the present invention, illustrating the relative positioning of the first and second sets of windings on the first and second integral toroidal sections which are connected to form a circuit;

FIG. 6 is an isometric view of the magnetic core in a closed state illustrating the alignment of the first and second pairs of opposing side walls, the relative positioning of the first integral toroidal section to the second integral toroidal section, and the aperture thereby formed by the cut portions of each first and second portion within which the current carrying conductor passes through;

Similarly referenced numerals refer to similar parts throughout the several figures.

DETAILED DESCRIPTION OF THE PREFERRED EMBODIMENT OF THE INVENTION

In referring to FIGS. 1a, 1b, 1c, and 1d, various magnetic cores 15 are illustrated that have been used in the prior art. It can be seen in FIGS. 1a, 1b, and 1c that many prior art magnetic cores 15 are of a square shape and contain many sections that are coupled together to form the complete magnetic cores 15. In these prior art magnetic cores 15 there are many discontinuities within the magnetic flux path of which will limit the accuracy of measurements and limit the sensitivity of the current sensor. In addition, the presence of the discontinuities in the flux path causes more power to be required for saturation of the magnetic cores 15 to occur.

Figure 1A:
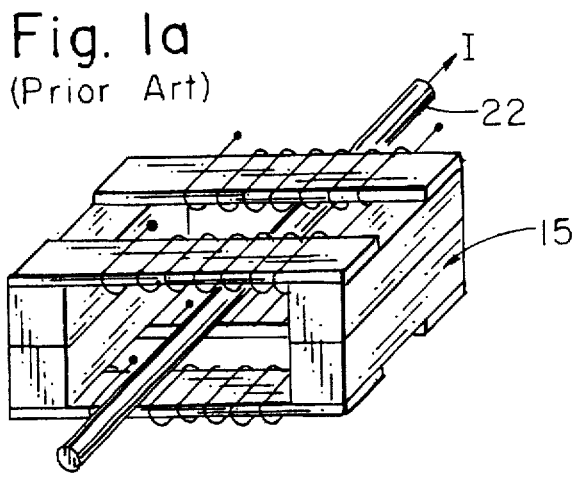
FIGS. 1a, 1b, 1c and 1d are illustrations of prior art magnetic cores utilized in current sensors having many discontinuities within the flux path as well as non-circular shapes which detract from the amount of flux saturation that is achievable in the magnetic core.
Figure 1B:
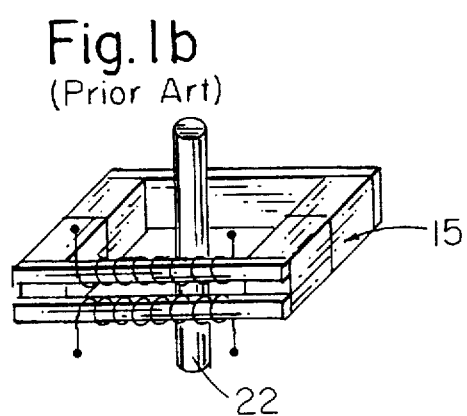
Figure 1C:
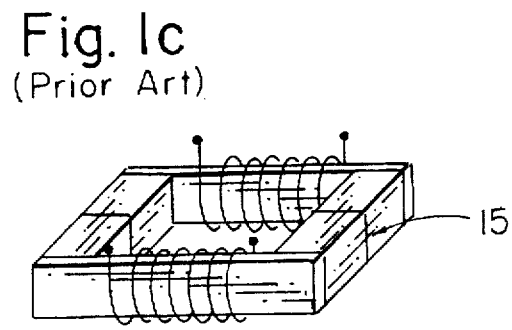
Figure 1D:
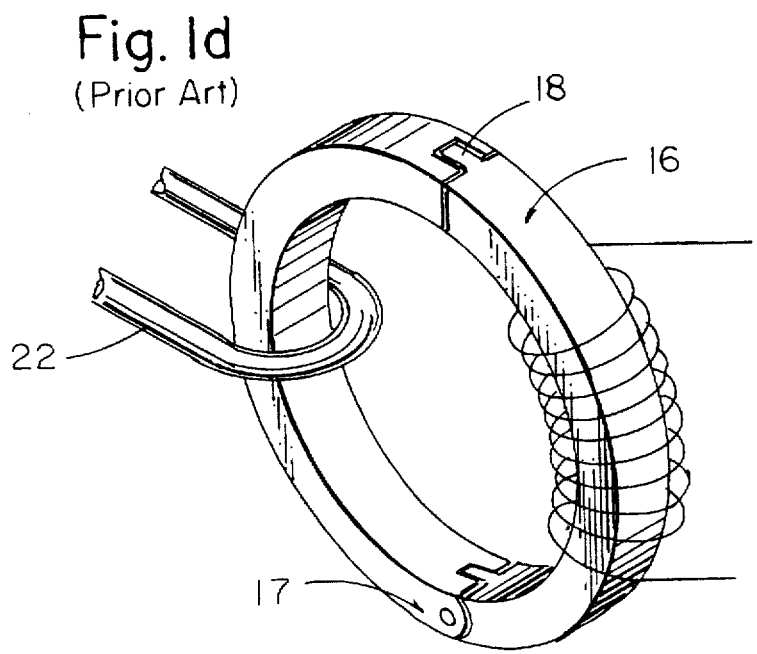

In FIG. 1d, another prior art magnetic core 16 is shown having a circular shape, a hinged section 17, and a notch and groove section 18. This circular shaped magnetic core 16 can open and close to facilitate the placement of a current carrying conductor 22 therethrough. However, the circular shaped magnetic core 16 of the prior art device shown in FIG. 1d operates as a current transformer in principle and is incapable of measuring Direct current. Additionally, the magnetic core 16 contains discontinuities within the magnetic flux path which results in more power being required in order to saturate the magnetic core 16.

Now, in referring to FIG. 2, the magnetic core 20 for a non-contact clamp-on current sensor is illustrated in its assembled state showing a current carrying conductor 22 passing therethrough in position to be measured. The magnetic core 20 for a non-contact clamp-on current sensor comprises a first portion 24 having a first integral toroidal section 26 and a second portion 28 having a second integral toroidal section 30. The first integral toroidal section 26 includes a first internal side 32 and a first pair of opposing integral side walls 34 that extend from the first internal side 32. A first and second cut portion 36 and 38 respectively, is interposed between the first pair of opposing integral side walls 34. The second integral toroidal section 30 includes a second internal side 40 of which a second pair of opposing integral side walls 42 extends therefrom. A third and fourth cut portion 44 and 46 respectively, is interposed between the second pair of opposing integral side walls 42.

Figure 3:
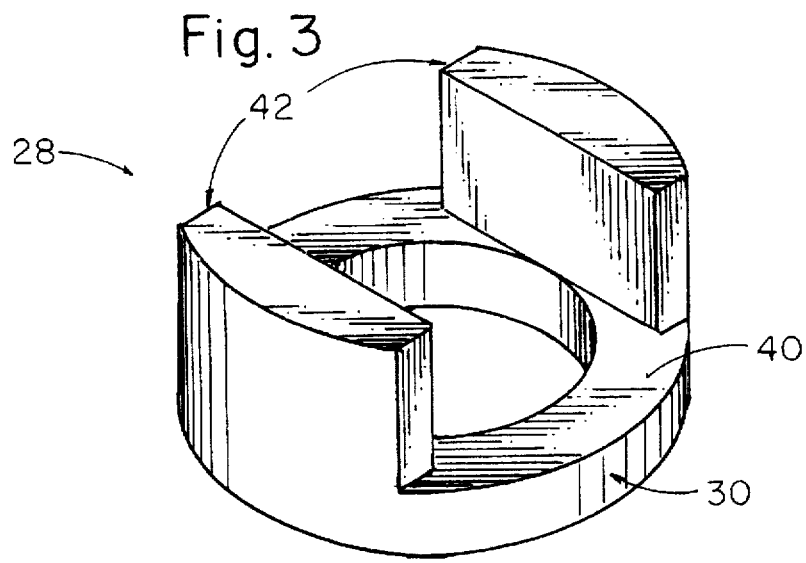
FIG. 3 is an isometric view illustrating the second portion of the magnetic core of the present invention where the second integral toroidal section and the second pair of opposing side walls that extend from the second integral toroidal section are shown in their relative position.

In referring to FIG. 3, the second pair of opposing integral side walls 42 can be seen extending from the second internal side 40 of the second integral toroidal section 30. The second pair of opposing integral side walls 42 are conformal with the outer circular shape of the second integral toroidal section 30.

Figure 4A:
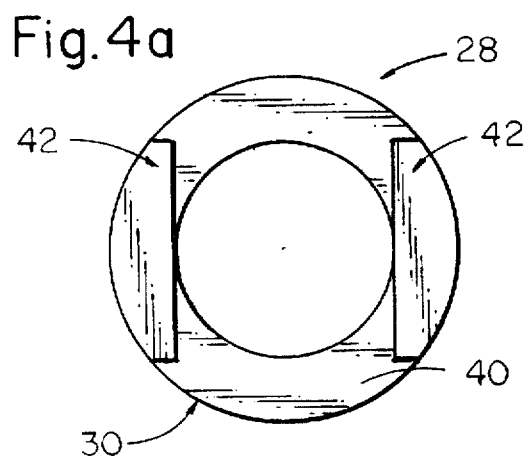
FIG. 4a is a top view of the second portion of the magnetic core illustrating the relative position of the second pair of opposing side walls and the second integral toroidal section.
Figure 4B:
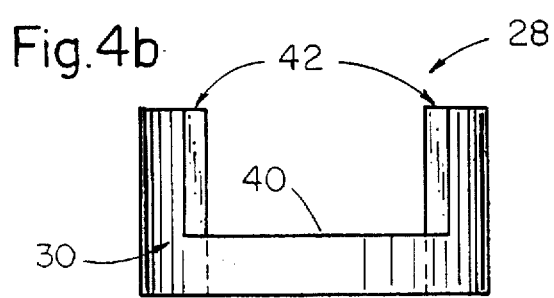
FIG. 4b is a front view of the second portion of the magnetic core illustrating the relative positioning of the second pair of opposing side walls and the second integral toroidal section.
Figure 4C:
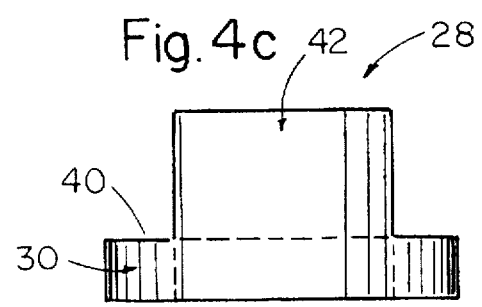
FIG. 4c is a side view illustrating the relative positioning of the second pair of opposing side walls and the second integral toroidal section.

In referring to FIGS. 4a, 4b, and 4c, the second portion 28 of the magnetic core 20 is shown in various views so as to better illustrate the second pair of opposing integral side walls 42. FIG. 4a is a top view of the second portion 28 of the magnetic core 20 which shows the relative positioning of the second pair of integral opposing side walls 42 on the second internal side 40 of the second integral toroidal section 30. In referring to FIGS. 4b and 4c, the second pair of opposing integral side walls 42 are illustrated in relation to the second integral toroidal section 30 as well as illustrating the third and fourth cut portions 44 and 46 thereof. The first portion 24 of the magnetic core 20 includes similar aspects as in the second portion 28. Essentially, the first portion 24 and the second portion 28 are identically the same in structure.

Figure 5:
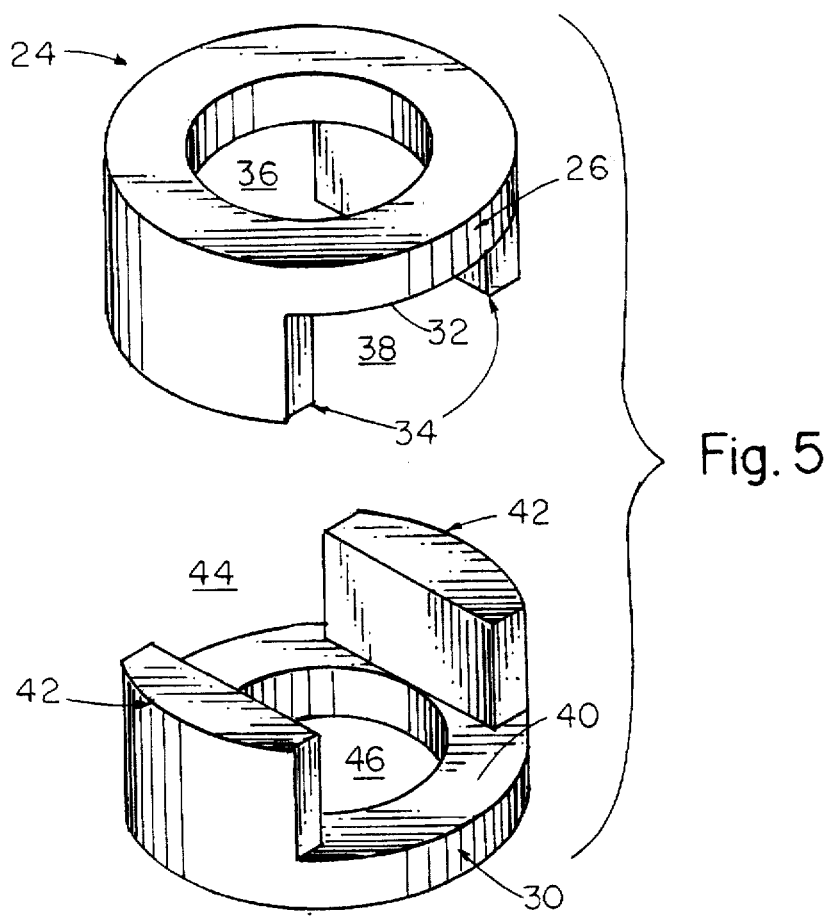
FIG. 5 is an isometric view of the first portion and second portion of the magnetic core for a non-contact clamp-on current sensor illustrating the relative alignment of the first pair of opposing side walls with the second pair of opposing side walls.

In now referring to FIG. 5, the magnetic core 20 comprised of the first portion 24 and the second portion 28 can be seen in relative position to each other while in the open state such that a current carrying conductor 22 could be readily placed in position to be measured.

Figure 6:
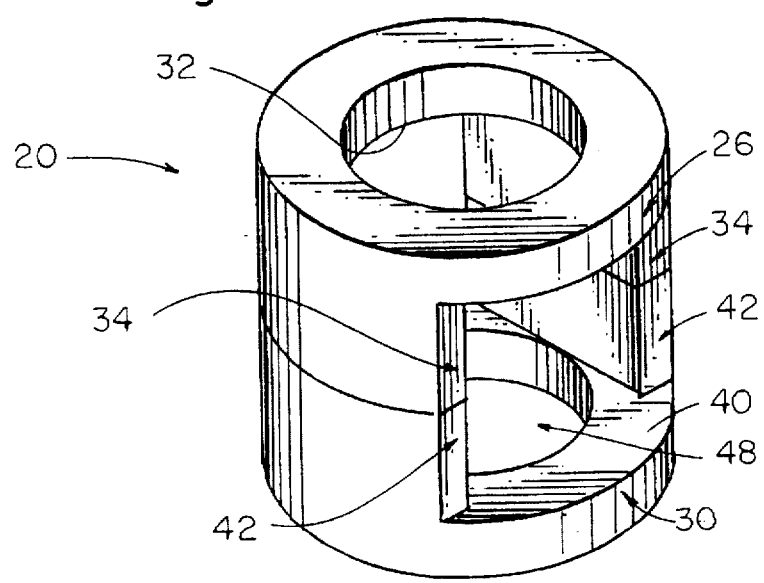

In referring to FIG. 6, the magnetic core 20 comprised of the first portion 24 and the second portion 28 can be seen in its closed state. While in its closed state, an aperture 48 is formed due to the alignment of the first, second, third, and fourth cut portions 36, 38, 44 and 46. The current carrying conductor 22 is placed within the defined aperture 48 in order for a line current measurement to be performed.

In referring back to FIG. 2, the magnetic core 20 for a non-contact clamp-on current sensor is shown illustrating the complete assembly. A first set of windings L1 and L2 are coupled to the first integral toroidal section 26 at the first and second cut portions 36 and 38, respectively. A second set of windings L3 and L4 are coupled to the second integral toroidal section 30 at the third and fourth cut portions 44 and 46 respectively. An excitation current source 50 is electrically connected to the first and second sets of windings L1 and L2, L3 and L4, so as to provide an excitation current thereto to produce an initial magnetic charging of the first and second integral toroidal sections 26 and 30.

Figure 8:
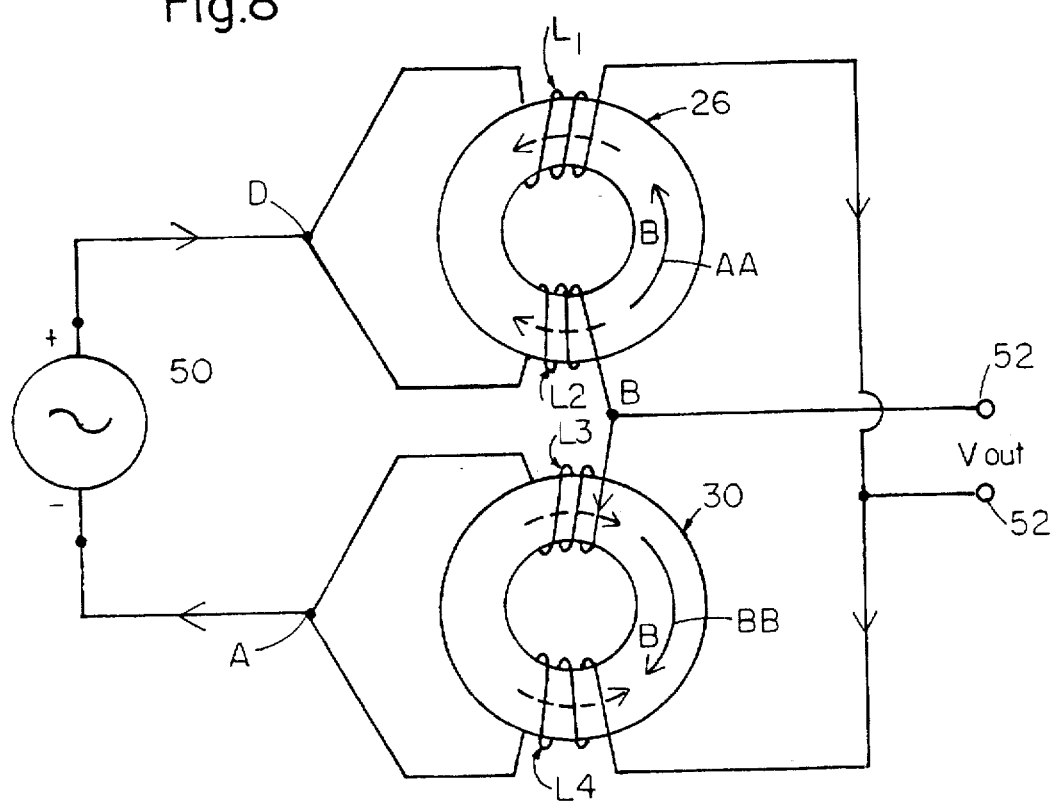
FIG. 8 is an electrical schematic of the circuit formed from the first and second set of windings being electrically coupled to the first and second integral toroidal sections of the magnetic core for a non-contact clamp-on current sensor.
Figure 9:
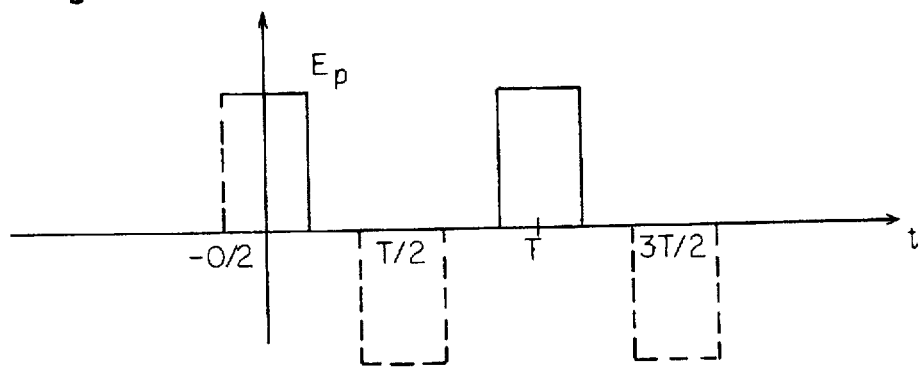
FIGS. 9, 10, 11, 12, 13, 14, 15, and 16 are graphical illustrations of the various waveforms associated with the behavior of the magnetic core for a non-contact clamp-on current sensor of which will aid in the explanation thereof.
Figure 10:
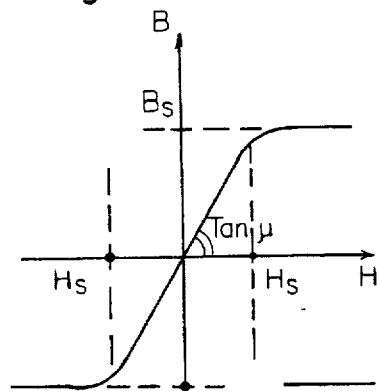

In referring to FIG. 8, an electrical schematic of the magnetic core 20 for a non-contact clamp-on current sensor is illustrated showing the various electrical connections which form the first and second sets of windings L1 and L2, L3 and L4, into a circuit. The first set of windings L1 and L2 are electrically connected in parallel. Of the second set of windings L3 and L4, L3 is electrically connected in series with L2, and L4 is electrically connected in series with L1. Output terminals 52 are positioned between the series connected L2 and L3 windings and between the series connected L1 and L4 windings. The output terminals 52 are to facilitate the measurement of an output voltage level that is produced by the first and second integral toroidal sections 26 and 30.

Upon operation, an excitation current of positive pulses is electrically applied to the windings L1 and L2, L3 and L4. The excitation current flows through the first set of windings L1 and L2 and the second set of windings L3 and L4 to set up a magnetic charge within the first and second integral toroidal sections 26 and 30. As the excitation current flows through the windings L1 and L2, L3 and L4, the magnetic field associated with the excitation current is coupled to the first and second integral toroidal sections 26 and 30. The magnetic field is retained in the first and second integral toroidal sections 26 and 30 in the form of magnetic flux which flows in the circular path shaped by the first and second integral toroidal sections 26 and 30, respectively.

Figure 7:
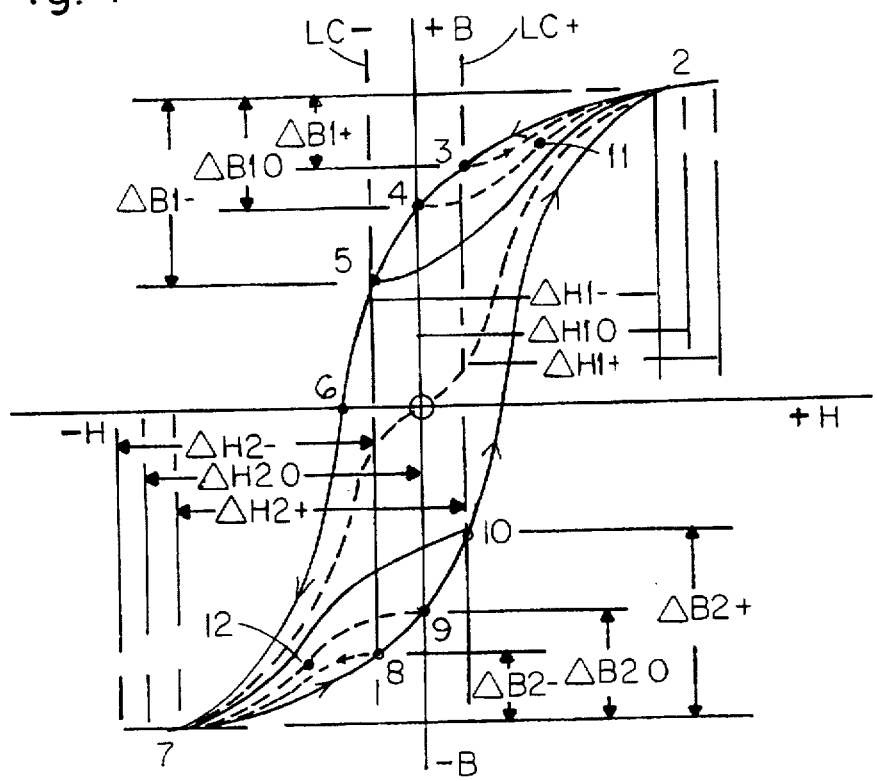
FIG. 7 is a representation of static hysteresis characteristics of the first and second integral toroidal sections with various markings to aid in the explanation of the dynamic functioning thereof.

In referring to FIG. 7, the interrelation of the magnetic field being coupled to the first and second integral toroidal sections 26 and 30 and the magnetic flux flowing within the first and second integral toroidal sections 26 and 30 may be better understood. FIG. 7 shows the major saturation hysteresis characteristic along the line 2, 3, 4, 5, 6, 7, 8, 9, 10, and 2 of the magnetic core 20. As is well known in the art, the major saturation hysteresis characteristics may also be referred to as the major saturation hysteresis curve, or loop. The upper half of FIG. 7 is useful in understanding what likely happens in the first integral toroidal section 26; and, the lower half of FIG. 7 is useful in understanding what likely happens in the second integral toroidal section 30 since the excitation current pulses in the first and second integral toroidal sections 26 and 30 are of opposite effect.

Upon applying an excitation current having a positive unipolar pulse, the magnetic core 20 will behave in a manner as represented along the line from pt. 1 to 2 on the graph in FIG. 7. Upon removing the excitation current from the first and second sets of windings L1 and L2, L3 and L4 thereby bringing the magnetic field intensity H down to zero, the first integral toroidal section 26 will behave in a manner that is represented along the lines 2 to 3 to 4. The leftover magnetic flux density B which is represented at pt. 4 on the graph is known as the residual magnetism. The second integral toroidal section 30 will behave in a similar manner except that, since the second set of windings, L3 and L4, produce a magnetic flux flowing in an opposite direction to that of which the magnetic flux is flowing in the first integral toroidal section 26, the second integral toroidal section 30 will obtain a negative saturation point, pt. 7 in FIG. 7. Upon the removal of the excitation current from the first and second sets of windings L1 and L2, L3 and L4 the second integral toroidal section 30 will behave in a manner along the line from pt. 7 to 8 to 9.

If the excitation current is then applied again, representing a positive H-field intensity, the first integral toroidal section 26 will behave in a manner represented along the line from pt. 4 to 11 to 2. The second integral toroidal section 30 will behave in a similar manner as the first integral toroidal section 26 in that it will behave in a manner as represented along the line from 9 to 12 to 7. Due to the inherent aspect of the magnetic core 20 to retain a residual magnetism once the initial magnetic field intensity H is removed, a negative magnetic field intensity H would be required in the first integral toroidal section 26 to bring the magnetic flux density B to zero as indicated at pt. 6. Thus, each curve represented by 4 to 11 to 2 to 3 to 4 and 9 to 12 to 7 to 8 to 9 will be repeated for every cycle of an excitation current pulse in the respective first and second integral toroidal sections 26 and 30.

In referring to FIG. 7, $\Delta H10$ represents the change in magnetic field intensity H in the first integral toroidal section 26 and $\Delta H20$ represents the change in magnetic field intensity H in the second integral toroidal section 30 when the excitation current is flowing and the respective first and second integral toroidal sections 26 and 30 are in a saturated state. When no line current is flowing in the current carrying conductor 22, the change in magnetic field intensities $\Delta H10$ and $\Delta H20$ are of equal and opposite polarities. In a similar fashion, when the excitation current is applied, the change in magnetic flux density B is represented by $\Delta B10$ in the first integral toroidal section 26 and $\Delta B20$ in the second integral toroidal section 30. The change in the magnetic flux densities $\Delta B10$ and $\Delta B20$ are of equal amounts and of opposite polarity. The change in magnetic flux density B of the respective first and second integral toroidal sections 26 and 30 are then subtracted at the output terminals 52 to determine a voltage difference. A zero voltage results at the output terminals 52 when no line current is flowing through the current carrying conductor 22.

Upon the introduction of a line current flowing in the current carrying conductor 22, the magnetic field intensity H and the magnetic flux density B in the respective first and second integral toroidal sections 26 and 30 will change. The first integral toroidal section 26 would behave in a manner as represented along the lines 3 to 2 to 3 when a positive polarity line current is flowing through the current carrying conductor 22. The second integral toroidal section 30 would behave in a manner as illustrated along lines 10 to 7 to 8 to 9 to 10 due to the same positive polarity line current flowing in the current carrying conductor 22. Thus, pt. 3 would represent the settling point in the first integral toroidal section 26 corresponding to when the excitation current in the windings L1 and L2, L3 and L4 is zero during the time between each individual excitation pulse. Similarly, pt. 10 would represent the settling point in the second integral toroidal section 30 when the excitation current flowing through the windings L1 and L2, L3 and L4 is zero between each individual excitation pulse.

In this situation, with a positive polarity line current, $\Delta H1+$ would represent the change in the magnetic field intensity H in the first integral toroidal section 26 and $\Delta H2+$ would represent the change in the magnetic field intensity H in the second integral toroidal section 30. Similarly, the magnetic flux density B would also experience changes due to the line current of positive polarity flowing through the current carrying conductor 22. In the first integral toroidal section 26, $\Delta B1+$ would represent the change in the magnetic flux density B caused by the positive flowing line current and $\Delta B2+$ would represent the change in the magnetic flux density B in the second integral toroidal section 30.

It can now be seen that the $\Delta B1+$ change in the magnetic flux density B in the first integral toroidal section 26 is of a different amount than the $\Delta B2+$ change in the magnetic flux density B taking place in the second integral toroidal section 30. This overall change in magnetic flux density B in the first and second integral toroidal sections 26 and 30 will manifest itself in an output voltage being detected on the output terminals 52 that corresponds to the difference between the corresponding changes ($\Delta B1+$ and $\Delta B2+$) of magnetic flux density B in the respective first and second integral toroidal sections 26 and 30. This resulting output voltage will be of a second harmonic of the fundamental frequency of the excitation current. Further, the respective output voltage will have a certain amplitude and polarity of which will be proportional to the line current flowing in the current carrying conductor 22. The polarity of the output voltage will dictate which direction the current is flowing in the current carrying conductor 22. The amplitude of the output voltage will dictate the strength of the line current in the current carrying conductor 22.

Similarly, when a negative polarity line current is flowing in the current carrying conductor 22, the first integral toroidal section 26 will experience a magnetic curve corresponding to the line from 5 to 2 to 3 to 4 to 5. When the excitation current flowing in the first and second sets of windings L1 and L2, L3 and L4 is at zero between the individual positive unipolar pulses, pt. 5 will be the settling point of the magnetic flux density B in the first integral toroidal section 26. The corresponding changes in the first integral toroidal section 26 would be represented by $\Delta H1-$ for the change in the magnetic field intensity H and $\Delta B-$ for the change in the magnetic flux density B.

The negative polarity pulse line current flowing in the current carrying conductor 22 would simultaneously cause changes to occur in the second integral toroidal section 30 that would be characterized by the magnetic loop following along the lines 8 to 7 to 8. The changes in the magnetic field intensity H in the second integral toroidal section 30 are represented by $\Delta H2-$, and the changes in the magnetic flux density B in the second integral toroidal section 30 are represented by $\Delta B2-$.

In a similar fashion as described previously, the changes in the magnetic flux density B in the respective first and second integral toroidal sections 26 and 30 will be subtracted and the resulting voltage difference will be detected on the voltage output terminals 52. It can be seen that the change in magnetic flux density $\Delta B2-$ in the second integral toroidal section 30 is less than the change in magnetic flux density $\Delta B1-$ occurring in the first integral toroidal section 26, and therefore, after subtracting the two quantities $((\Delta B2-) - (\Delta B1-))$, the resulting output voltage will be negative, representing a negatively flowing line current. Again, it is noted that the output voltage will be of a second harmonic of the fundamental frequency of the excitation current.

Figure 11:
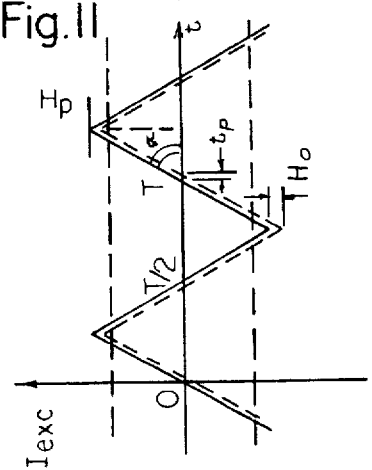
Figure 13:
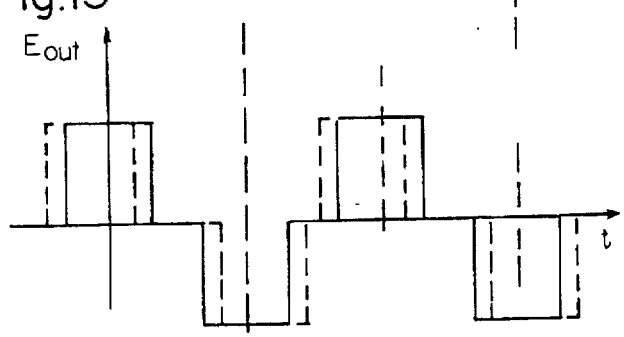
Figure 14:
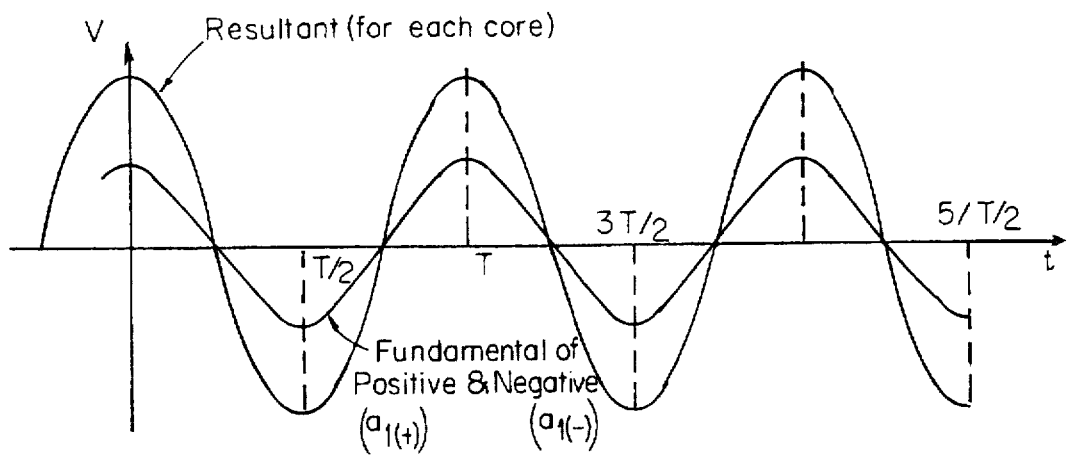
Figure 15:
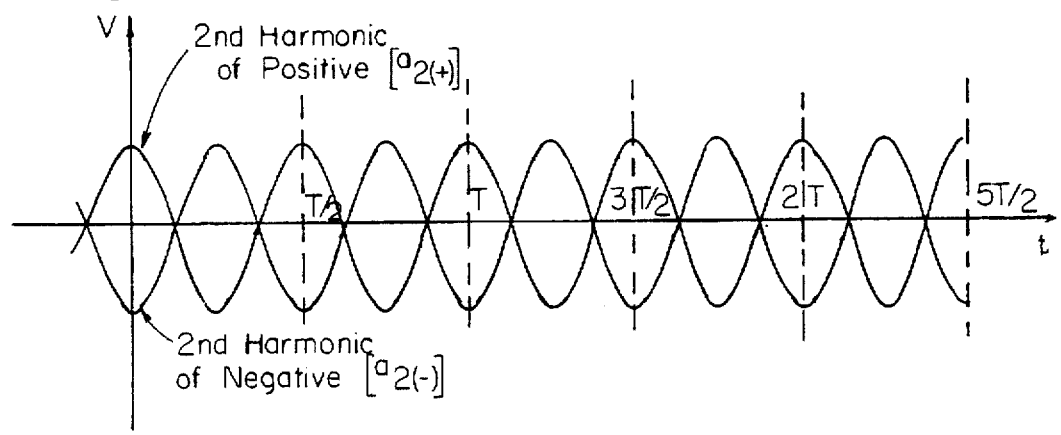
Figure 16:
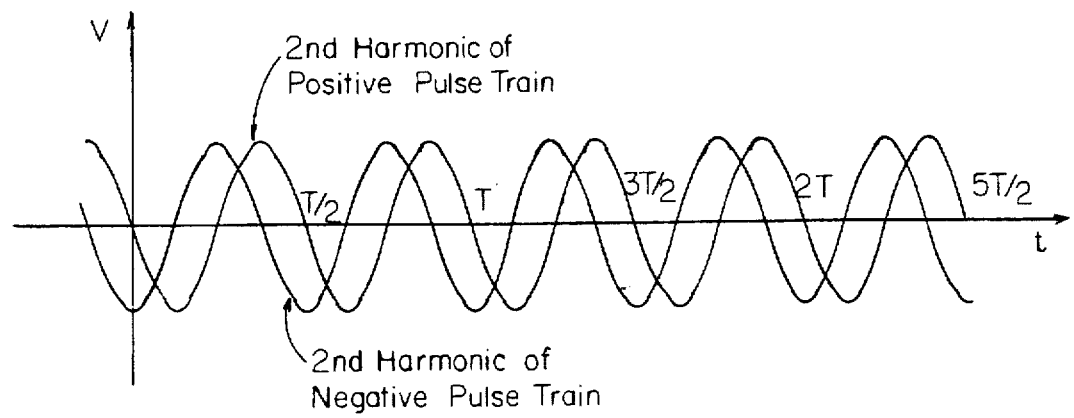

The proportionality of the output voltage to the measured line current in the current carrying conductor 22 can be illustrated further by referring to FIGS. 9–16 in conjunction with the following mathematical relationships:

Referring to FIG. 2, with no line current in the current carrying conductor 22 and the excitation current applied, as in FIG. 11, the induced voltage $E_{CA}$ at winding $L_4$ due to excitation current in $L_3$ will be:

$$E_{CA} = NA \frac{dB}{dt} \times 10^{-8} = NA\mu \times 10^{-8} \frac{dH}{dt}$$

where $E_{CA}$ is the induced voltage at terminals C and A.

$$\frac{dB}{dt} = \frac{\mu H_p}{T/4} = 4f\mu H_p$$

Figure 12:
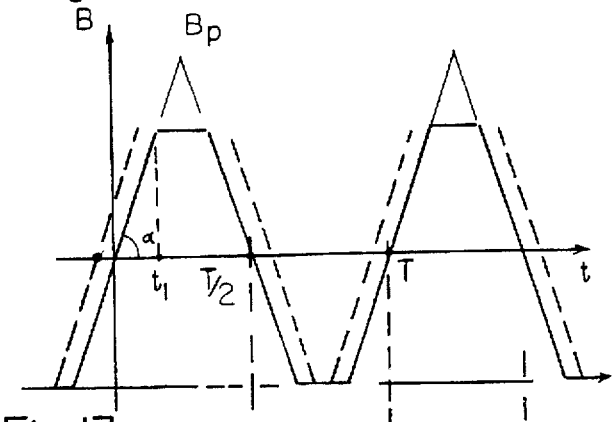

(From FIG. 12, for $-t_1+nT<t<t_1+nT$)

$$\frac{dB}{dt} = -\frac{\mu H_p}{\frac{T}{4}} = -4f\mu H_p$$

(for intervals: $T/2-t_1+nT<t<T/2+t_1+nT$)

For pulse width:

$$\text{Tan}\alpha = \frac{B_{sat}}{t_1} = \frac{B_p}{\frac{T}{4}} = 4f\mu H_p; \text{ and } t_1 = \frac{B_{sat}}{4f\mu H_p}$$

Then, the pulse width is:

$$d = 2t_1 = \frac{B_{sat}}{2f\mu H_p}$$

Therefore $E_{CA}$ consists of a pulse train with the peak amplitude of $E_p = (NA\mu \times 10^{-8})(4 fH_p)$; which is alternately in negative directions, having a pulse width of $$\frac{B_s}{2f\mu H_p}.$$

The output voltage can be separated into a set of a positive going pulse train and a set of a negative going pulse train.

The Fourier components of a pulse train having a width of "d" and amplitude of $E_{peak}$, ($E_p$), is: (refer to FIG. 9)

It then follows that $E_{CA(+)}$ is an even function, therefore there are no sine components in the waveform.

$$E_{CA(+)} = \frac{E_p d}{T} + \frac{2E_p d}{T} \sum_{n=1}^{\infty} \left( \frac{\sin\left(\frac{n\pi d}{T}\right)}{\frac{n\pi d}{T}} \cos(n\omega t) \right)$$

$$\frac{E_p d}{T} = NA\mu \times 10^{-8} \times 4f H_p \times \frac{B_s}{2f\mu H_p} \times f = NA \times 10^{-8} \times 2f B_s$$

Therefore:

$$a_n = NA \times 10^{-8} \times 4 f B_s \times \frac{2\mu H_p}{n\pi B_s} \sin\left(\frac{n\pi B_s}{2\mu H_p}\right) \cos(n\omega t)$$

$$\frac{n\pi d}{T} = n\pi f \times \frac{B_s}{2f\mu H_p} = \frac{n\pi B_s}{2\mu H_p}$$

The fundamental component is then:

$$a_{1(+)} = NA \times 10^{-8} \times 8f\mu \times \frac{H_p}{\pi B_s} \sin\left(\frac{\pi B_s}{2\mu H_p}\right) \cos(\omega t)$$

and the second harmonic is:

$$a_{2(+)} = NA \times 10^{-8} \times 4f\mu \frac{H_p}{\pi B_s} \sin\left(\frac{\pi B_s}{\mu H_p}\right) \cos(2\omega t)$$

For the negative pulse train, $E_p$ is:

$$E_p = -NA\mu \times 10^{-8} \times 4 f H_p; \text{ and } t = \tau + T/2$$

Therefore:

$$E_{CA(-)} = -\frac{E_p d}{T} - \frac{2E_p d}{T} \sum_{n=1}^{\infty} \frac{\sin\left(\frac{n\pi d}{T}\right)}{\frac{n\pi d}{T}} \cos\left(n\omega t + n\omega \frac{T}{2}\right)$$

-continued $$E_{CA(-)} = -\frac{E_P d}{T} - \frac{2E_p d}{T} \sum_{n=1}^{\infty} \frac{\sin\left(\frac{n\pi d}{T}\right)}{\frac{n\pi d}{T}} \cos(n\omega t + n\pi)$$

Now, the fundamental component of the negative pulse train is:

$$a_{1(-)} = -NA \times 10^{-8} \times 8f\mu \frac{H_p}{\pi B_s} \sin\left(\frac{\pi B_s}{2\mu H_p}\right) \cos(n\omega t + \pi)$$

and $$a_{2(-)} = -NA \times 10^{-8} \times 4f\mu \frac{H_p}{\pi B_s} \sin\left(\frac{\pi B_s}{\mu H_p}\right) \cos(n\omega t + 2\pi)$$

or $a_{2(+)} = -a_{2(-)}$ and $a_{0(+)} = a_{0(-)}$

The induced voltage between terminals C and A is then found from:

$$E_{CA} = E_{CA(+)} + E_{CA(-)} \text{ where } a_z = a_z(+) + a_z(-) = 0; \text{ and } a_1 = a_{1(+)} + a_{1(-)} = 2a_{1(+)}$$

Thus, it can be seen that with no line current in the current carrying conductor 22, the components of $E_{CA}$ consist of only the fundamental harmonics which are additive. The second harmonics cancel each other out. In a similar manner, the induced voltage between terminals B and A ($E_{BA}$) can be calculated where:

$$E_{BA} + E_{BA(+)} + E_{BA(-)}; \; a_2 = a_{2(+)} a_{2(-)} = 0; \; a_1 = a_{1(+)} + a_{1(-)} = 2a_{1(+)};$$

and $$V_{OUT} = E_{BC} = E_{BA} - E_{CA} = 0$$

As can be seen with no aperture current, there will be no voltage present at the output.

Now, in referring to FIG. 2, a magnetizing force $H_o$ will be generated when an aperture current $I_o$ is applied. This magnetizing force $H_o$ will in turn then cause a resulting phase shift between the positive and negative going pulse trains.

From FIG. 11, the phase shift can now be calculated from:

$$\tan\alpha = \frac{H_p}{\frac{T}{4}} = \frac{H_o}{t_p} \Rightarrow t_p = \frac{H_o}{4fH_p}$$

$$\phi_n = n\omega t_p = n2\pi f \frac{H_o}{4fH_p} = \frac{n\pi H_o}{2H_p}$$

$E_{CA(+)}$ and $E_{CA(-)}$ are both even functions:

$$E_{CA} + E_{CA(+)} + E_{CA}(-) = \frac{E_p d}{T} +$$

$$\frac{2E_p d}{T} \sum_{n=1}^{\infty} \frac{\sin\left(\frac{n\pi d}{T}\right)}{\frac{n\pi d}{T}} \cos(n\omega t + \phi_n) -$$

-continued $$\frac{E_p d}{T} - \frac{2E_p d}{T} \sum_{n=1}^{\infty} \frac{\sin\left(\frac{n\pi d}{T}\right)}{\frac{n\pi d}{T}} \cos(n\omega t + n\pi - \phi_n)$$

$$\frac{n\pi d}{T} = \frac{n\pi B_s}{2\mu H_p} \text{ and } \frac{E_p d}{T} = NA \times 10^{-8} \times 2fB_s$$

$$E_{CA} = 4NA \times 10^{-8} \times$$

$$fB_s \sum_{n=1}^{\infty} \frac{\sin\left(\frac{n\pi B_s}{2\mu H_p}\right)}{\frac{n\pi B_s}{2\mu H_p}} [\cos(n\omega t + \phi_n) - \cos(n\omega t + n\pi - \phi_n)]$$

In a similar fashion $E_{BA}$ can be calculated:

$$E_{BA} = E_{BA(+)} + E_{BA(-)}$$

$$E_{BA} = 4NA \times 10^{-8} \times$$

$$fB_s \sum_{n=1}^{\infty} \frac{\sin\left(\frac{n\pi B_s}{2\mu H_p}\right)}{\frac{n\pi B_s}{2\mu H_p}} [\cos(n\omega t - \phi_n) - \cos(n\omega t + n\pi + \phi_n)]$$

Note that in the above equation, the polarity of $\phi_n$ is reversed. This is due to the fact that the magnetic field generated by the line current, in this section of the core, will be additive to the magnetic field generated by the excitation current.

The core output voltage can now be calculated from:

$$V_{OUT} = E_{BC} = E_{BA} - E_{CA}; \text{ and}$$

$$E_{BA} - E_{CA} = 4NA \times 10^{-8} \times$$

$$fB_s \text{ sig} \infty n=1 \frac{\sin\left(\frac{n\pi B_s}{2\mu H_p}\right)}{\frac{n\pi B_s}{2\mu H_p}} [(\cos(n\omega t - \phi_n) -$$

$$\cos(n\omega t + n\pi + \phi_n)) - (\cos(n\omega t + \phi_n) - \cos(n\omega t + \pi - \phi_n))]$$

Next, using the identity ⇒

$$\cos a - \cos b = -2\sin\left(\frac{a+b}{2}\right)\sin\left(\frac{a-b}{2}\right)$$

$$V_{out} = 8NA \times 10^{-8} \times$$

$$fB_s \sum_{n=1}^{\infty} \frac{\sin\left(\frac{n\pi B_s}{2\mu H_p}\right)}{\frac{n\pi B_s}{2\mu H_p}} \left[ \sin\left(n\omega t + \frac{n\pi}{2}\right) \sin\left(\frac{n\pi}{2} + \phi_n\right) + \sin\left(n\omega t + \frac{n\pi}{2}\right) \sin\left(\frac{n\pi}{2} - \phi_n\right) \right]$$

Now, using the identity →

$$\sin a + \sin b = 2\sin\left(\frac{a+b}{2}\right)\cos\left(\frac{a-b}{2}\right)$$

$$V_{out} = 16NA \times 10^{-8} \times$$

$$fB_s \sum_{n=1}^{\infty} \frac{\sin\left(\frac{n\pi B_s}{2\mu H_p}\right)}{\frac{n\pi B_s}{2\mu H_p}} \sin\left(n\omega t + \frac{n\pi}{2}\right) \sin(\phi_n)\cos\left(\frac{n\pi}{2}\right)$$

Then by substituting →

$$\phi_n = \frac{n\pi H_o}{2H_p}$$

each component of output voltage is represented by:

$$a_n = NA \times 10^{-8} \left(\frac{32\mu f H_p}{n\pi}\right) \sin\left(\frac{n\pi H_s}{2H_p}\right) \sin\left(\frac{n\pi H_o}{2H_p}\right) \sin\left(n\omega t + \frac{n\pi}{2}\right) \cos\left(\frac{n\pi}{2}\right)$$

For n=1, cos (nπ/2)=0. Therefore the fundamental component is zero; $a_1=0$.

The second harmonic can then be calculated from the following relationship:

$$a_2 = NA \times 10^{-8} \left(\frac{16\mu f H_p}{\pi}\right) \sin\left(\frac{\pi H_s}{H_p}\right) \sin\left(\frac{\pi H_o}{H_p}\right) \sin(2\omega t)$$

$$\text{For } H_o \ll H_p \Rightarrow \sin\left(\frac{\pi H_o}{H_p}\right) = \frac{\pi H_o}{H_p}$$

Then:

$$a_2 = NA \times 10^{-8} (16\mu f H_o) \sin\left(\frac{\pi H_s}{H_p}\right) \sin(2\omega t)$$

Thus, by having the core parameters, such as A, μ, $H_s$, as well as the frequency (f) and the amplitude of the excitation current ($H_p$) all held constant, the second harmonic then becomes linearly proportional to the field generated by the line current in the current carrying conductor 22.

It is to be understood that due to the toroidal shape of the respective first and second integral toroidal sections 26 and 30 and the lack of discontinuities within the flow path of the magnetic flux within each of the first and second integral toroidal sections 26 and 30, the magnetic behavior that takes place in the integral toroidal sections 26 and 30 will be more repeatable and thus more accurate. The respective settling points along the magnetic curves associated with each of the first and second integral toroidal sections 26 and 30 that correspond to zero (H=0 on the chart in FIG. 7) will be more repeatable from measurement to measurement. When the settling point varies from pts. 4 and 9 when there is no line current flowing in the current carrying conductor 22, it is known as zero errors. When these zero errors occur, measurements become inaccurate due to the variances erroneously influencing the quantities ΔB1+/− and ΔB2+/−. The design of the magnetic core 20 in the present invention overcomes the inadequacies of the prior art relating to poor saturation and problems with zero errors.

In referring to FIG. 8, an electrical schematic illustrates the electrical coupling of the first and second sets of windings L1 and L2, L3 and L4 respectively, to the first and second integral toroidal sections 26 and 30 of the magnetic core 20 which form a circuit. The directional arrows AA and BB in the first and second integral toroidal sections 26 and 30, respectively, indicate the direction of magnetic flux flow.

An excitation current source 50 is electrically coupled to the first and second sets of windings L1 and L2, L3 and L4, respectively, so as to provide an excitation current thereto. Output terminals 52 are positioned between the first and second integral toroidal sections 26 and 30 to facilitate the detection of output voltages corresponding to line currents flowing through the current carrying conductor 22.

The present disclosure includes that contained in the appended claims as well as that of the foregoing description. Although this invention has been described in its preferred form with a certain degree of particularity, it should be understood that the present disclosure of the preferred form has been made only by way of example and that numerous changes in the details of construction and combination and arrangement of parts may be resorted to without departing from the spirit and scope of the invention.

Now that the invention has been described,
What is claimed is:

1. A current sensor for measuring the flow of line current through a current carrying conductor having a magnetic core adapted for encircling said conductor, said magnetic core comprising in combination:

a first portion, said first portion including a first integral toroidal section having a first internal side, a first pair of opposing side walls extending from said first internal side, a first cut portion positioned between said first pair of opposing side walls, and a second cut portion positioned between said first pair of opposing side walls opposite said first cut portion;

a second portion, said second portion including a second integral toroidal section having a second internal side, a second pair of opposing side walls extending from said second internal side, a third cut portion positioned between said second pair of opposing side walls, and a fourth cut portion positioned between said first pair of opposing side walls opposite said third cut portion, said second pair of opposing side walls being in alignment with and coupled to said first pair of opposing side walls thereby forming an aperture therethrough, said aperture facilitating the placement of said current carrying conductor therein;

a first set of windings positioned on said first integral toroidal section thereby producing flux in said first integral toroidal section due to an excitation current flowing through said first set of windings;

a second set of windings positioned on said second integral toroidal section thereby producing flux in said second integral toroidal section due to said excitation current flowing through said second set of windings; and a means for connecting said first and second sets of windings to form a circuit.

2. A current sensor for measuring the flow of line current through a current carrying conductor having a magnetic core adapted for encircling said current carrying conductor, said magnetic core comprising in combination:

a first portion including a first integral toroidal section having a first internal side, a first pair of opposing side walls extending from said first internal side, and a first set of windings on said first integral toroidal section;

a second portion including a second integral toroidal section having a second internal side, a second pair of opposing side walls extending from said second internal side, and a second set of windings; and a means for connecting said first and second sets of windings to form a circuit, whereby said first portion and said second portion are coupled to each other at said first and second pairs of side walls to thereby encircle said current carrying conductor with said magnetic core, said first set of windings thereby producing a flux in said first integral toroidal section due to an excitation current flowing through said first set of windings, said second set of windings thereby producing flux in said second integral toroidal section flowing in an opposite direction as in said first integral toroidal section due to said excitation current flowing through said second set of windings, said magnetic core being in a toroid shape so as to facilitate having a more thorough flux saturation therein thereby reducing the occurrence of zero errors in measurements.

3. A method for measuring a line current in a current carrying conductor comprising the steps of:

providing a magnetic core having a first portion and a second portion, said first portion including a first integral toroidal section having a first internal side, and a first pair of opposing side walls extending from said first internal side, said second portion including a second integral toroidal section having a second internal side, and a second pair of opposing side walls extending from said second internal side, said first and second portions forming an aperture therethrough being coupled together at said first and second pairs of opposing side walls thereby providing a first set of windings coupled to said first integral toroidal section whereby said first set of windings produces a flux in said first integral toroidal section;

providing a second set of windings coupled to said second integral toroidal section whereby said second set of windings produces a flux in said second integral toroidal section of which flows in an opposite direction than in the first integral toroidal section;

placing a current carrying conductor through said aperture in said magnetic core;

providing an excitation current source electrically coupled to said first and second sets of windings whereby an excitation current flows through said first and second set of windings;

providing output terminals positioned intermediate to said first and second sets of windings; and providing a means for detecting an output voltage on said output terminals that is proportional in amplitude and polarity to the line current being measured.

* * * * *